United States Patent [19]

Bakx et al.

[11] Patent Number: 5,233,577
[45] Date of Patent: Aug. 3, 1993

[54] MAGNETO-OPTICAL RECORDING APPARATUS AND ENERGIZING CIRCUIT FOR USE IN SUCH A MAGNETO-OPTICAL RECORDING APPARATUS

[75] Inventors: Johannes L. Bakx; Petrus C. J. Hoeven, both of Eindhoven, Netherlands

[73] Assignee: U.S. Philips Corp., New York, N.Y.

[21] Appl. No.: 830,784

[22] Filed: Feb. 3, 1992

Related U.S. Application Data

[63] Continuation of Ser. No. 704,659, May 20, 1991, abandoned, which is a continuation of Ser. No. 253,797, Oct. 4, 1988, abandoned, which is a continuation-in-part of Ser. No. 162,827, Mar. 2, 1988, abandoned.

[30] Foreign Application Priority Data

Oct. 14, 1987 [NL] Netherlands ............ 8702451

[51] Int. Cl.$^5$ ............ G11B 13/04; G11B 11/10; G11B 11/12
[52] U.S. Cl. ............ 369/13; 360/59; 360/114
[58] Field of Search ............ 369/13; 360/59, 114, 360/60, 61, 66; 361/139, 140, 143, 145, 146, 147, 152, 155, 156

[56] References Cited

U.S. PATENT DOCUMENTS

| | | | |
|---|---|---|---|
| 4,466,027 | 8/1984 | Howell et al. | 360/66 |
| 4,712,203 | 12/1987 | Saito et al. | 360/59 |
| 4,872,078 | 10/1989 | Gerber et al. | 360/114 |
| 4,937,802 | 6/1990 | Omori et al. | 369/13 |
| 5,020,041 | 5/1991 | Nakao et al. | 360/114 |

FOREIGN PATENT DOCUMENTS

| | | |
|---|---|---|
| 3008692 | 9/1981 | Fed. Rep. of Germany. |
| 55-132521 | 10/1980 | Japan .................. 360/66 |
| 61-190741 | 8/1986 | Japan. |
| 1-248341 | 3/1989 | Japan. |
| 1277225 | 12/1986 | U.S.S.R. .................. 361/152 |

OTHER PUBLICATIONS

"Current Reversal in Inductive Loads" IBM Technical Disclosure Bulletin, vol. 11, No. 10 Mar. 1969.
"Erasable Magneto-Optical Recording" Philips Technical Review, vol. 42, No. 2 Aug. 1985.

*Primary Examiner*—Robert W. Beausoliel, Jr.
*Attorney, Agent, or Firm*—William L. Botjer

[57] ABSTRACT

A magneto-optical recording apparatus provided with a magnetic field modulator (8). The magnetic-field modulator (8) has a field coil (18) for generating a magnetic field and switches (11,12,15,16,22) for coupling at least one terminal (17) of the magnet coil (18) to a first potential point (10) at a first potential (Vp) or a second potential point (14) at a second potential (Vn) depending on the logic value of a control signal (vs), in order to produce in the field coil an alternating current whose polarity depends on the logic value. The field coil (18) is arranged in a parallel resonant circuit (18,21). The switches have means (12,16) for inhibiting, after the terminal (17) has been uncoupled from one of the potential points (10,14), current supply from the other potential point for a time interval corresponding to half the resonant period of the resonant circuit (18,21). This magnetic-field modulator provides a very rapid reversal of the current through the field coil.

8 Claims, 3 Drawing Sheets

MAGNETO-OPTICAL RECORDING APPARATUS AND ENERGIZING CIRCUIT FOR USE IN SUCH A MAGNETO-OPTICAL RECORDING APPARATUS

CROSS REFERENCE TO RELATED APPLICATION

This is a continuation of application Ser. No. 07/704,659, filed May 20, 1991, which is a continuation of Ser. No. 07/253,797 filed Oct. 4, 1988 which is a continuation in part of Ser. No. 162,827 filed Mar. 3, 1988 all of which have been abandoned.

BACKGROUND OF THE INVENTION

The invention relates to a magneto-optical recording apparatus for recording an information signal on a magneto-optical record carrier, which recording apparatus comprises a field coil for generating a magnetic field in the record carrier, an energizing circuit for energizing the field coil, and a control circuit for controlling the energizing circuit depending on the information signal in order to modulate the generated magnetic field in conformity with the information signal.

The invention further relates to an energizing circuit for use in such a magneto-optical recording apparatus.

For recording in magneto-optical materials it was customary until now to magnetise the magneto-optical material in a specific direction prior to recording and subsequently during recording to expose the material to a magnetic field whose direction is opposite to the direction of the previously applied magnetization and at the same time to hat the material locally by means of an intensity-modulated laser beam to a temperature near the Curie point, to produce a pattern of magnetic domains corresponding to the modulation pattern and having a direction of magnetization which differs from the surrounding area.

This method has the drawback that the previously recorded part must be erased before a new recording can be made.

A recording technique which mitigates this drawback is already known from Philips Technical Review, Vol. 42, no. 2, August 1985, page 41. In this recording technique the magnetic field is modulated instead of the laser beam. However, this recording technique using magnetic-field modulation is not utilised in practice because no satisfactory solution has been found for the circuit for energizing the field coil. The problem then encountered is that as a result of the strong magnetic field (approximately 200–300 oersted) the energy stored in the magnetic field is so high that the magnetic field can only be reversed rapidly enough by applying a large voltage difference across the magnetic coil, which in principle can be realised by means of voltage sources having a high output voltage (approximately 100 V). The field coil can then be energized via a series resistor to limit the steady-state current. In conventional magneto-optical recording apparatuses, in which the remainder of the electronic circuitry operates with a supply voltage of 5–15 V, magnetic-field modulation therefore means that an additional 100-V voltage source has to be used, which makes magneto-optical recording with a modulated magnetic field impracticable, the use of the series resistor has the disadvantage that a substantial amount of heat (approximately 10 W) is dissipated in the series resistor.

SUMMARY OF THE INVENTION

It is the object of the invention to provide a magneto-optical recording apparatus which requires a substantially lower supply voltage and which has an energizing circuit with minimal dissipation.

According to the invention this object is achieved in that the field coil is arranged in a parallel resonant circuit, in that the energizing circuit comprises switches controlled by the control circuit for alternately closing a first and a second current path in order to energize the field via said current paths alternately with a positive and a negative current, and current-inhibiting means constructed to inhibit after interruption of one of the current paths, the current supply to the field coil via the other current path for a time interval corresponding to substantially half the resonant period of the resonant circuit.

Since the field coil is arranged in the resonant circuit an oscillation will arise in the resonant circuit after blocking of a current path so that the current through the field coil will be sinusoidal. The current direction is then reversed. After half a resonant period the current reaches an extreme value, whose absolute value is substantially equal to the absolute value at the instant of uncoupling of the terminal but whose sign is opposite to the sign at the uncoupling instant. By energizing the field coil via the other current path at the instant at which the extreme value is reached the current can be maintained at said extreme value. Since for maintaining this current it is merely required to compensate for the voltage drop across the resistance of the field coil, the voltage across this coil need only be a few volts, enabling a low-voltage source already needed for the other electronic circuitry to be employed for the power supply of the magnetic-field modulator.

An embodiment of the magneto-optical recording apparatus is characterized in that the current-inhibiting means comprise rectifying elements arranged in the current paths.

This embodiment advantageously utilizes the fact that when the extreme current value is reached the voltage across the coil is reversed, the current path via the other current path circuit being inhibited automatically for half the resonant period by the use of the rectifying elements.

Another embodiment of the magneto-optical recording apparatus, which is very suitable for recording d.c.-free encoded signals, is characterized in that a high-pass filter is arranged in a common part of the current paths, which filter includes the parallel resonant circuit, in that a first one of said current paths is adapted to connect, when closed, said common part to a d.c. source, and in that a second one of said current paths is adapted to short-circuit, when closed, said common part. This embodiment is based on the recognition of the fact that in the case of d.c. free information signals the use of a high-pass filter in the power-supply circuit has no influence on the strength of the magnetic field produced by the energizing current, so that it is possible to energize the field coil from a single power supply.

A further embodiment of the invention is characterized in that the switches are transistors of the FET type.

This embodiment has the advantage that a type of switch is used, which is capable of withstanding the high reverse voltages produced across the switches when the current paths are opened, uncoupled, so that very short switching times can be obtained.

Moreover, for the currents required in magneto-optical recording, which are of the order of magnitude of 1 Ampère, the switching times of FET-transistors are substantially smaller than those of bipolar transistors which can handle both high reverse voltages and the desired large currents. If the field coil is energized by means of a bridge circuit comprising FET-transistors the prevailing reverse voltage is divided between two transistors, which renders the circuit even more immune to these reverse voltages.

In conventional FET transistors the heat dissipation in p-channel FETs is substantially higher than in n-channel FETs, so that it is desirable to use energizing circuits comprising only FET-transistors of the same channel type.

An embodiment of the magneto-optical recording apparatus comprising an energizing circuit which meets this requirement is characterized in that the energizing circuit comprise a series arrangement to be connected to a d.c. source, which series arrangement comprises, in this order, a first rectifying element, a first FET-transistor, a second rectifying element, and a second FET-transistor of the same channel-type as the first FET-transistor, the high-pass filter being connected to the junction point between the first rectifying element and the first FET-transistor and to the junction point between the second rectifying element and the second FET-transistor, the energizing circuit further comprising an impedance for coupling the junction point between the first FET-transistor and the second rectifying element to a point of fixed potential.

BRIEF DESCRIPTION OF THE DRAWINGS

Embodiments of the invention will now be described more in detail, by way of example, with reference to FIGS. 1 to 7, of which

DETAILED DESCRIPTION OF THE PREFERRED EMBODIMENT

Figure 1:
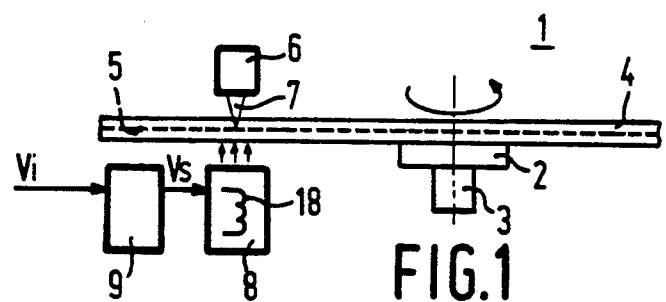
FIG. 1 shows an embodiment of a magneto-optical recording apparatus accordance with the invention.

FIG. 1 shows an embodiment of a magneto-optical recording apparatus 1 in accordance with the invention. A record carrier 4 is rotated by a drive means comprising a turntable 2 and a motor 3. The record carrier 4 is provided with a recording layer 5 of a magneto-optical material of a customary type. By means of an optical head 6 a radiation beam 7, for example a laser beam, is aimed at the recording layer 5. The magneto-optical material is then heated to a temperature near the Curie point. By means of a magnetic-field modulator 8 the heated portion of the magneto-optical material is exposed to a magnetic field of adequate strength to magnetize the heated portion in a direction which depends on the direction of the magnetic field. The magnetization persists after cooling. The magnetic modulator 8 modulates the magnetic field in conformity with a control signal Vs which is derived from an information signal Vi by an encoding circuit 9, for example an EFM encoder. Thus, a pattern of magnetic domains representative of the information signal is formed in the recording layer 5.

Figure 2:
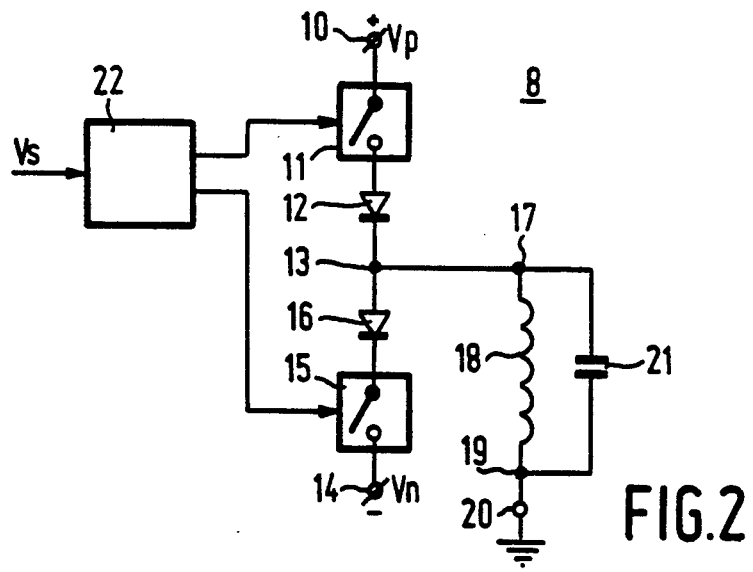
FIGS. 2, 4, 5, 6 and 7 show magnetic-field modulators for use in a magneto-optical recording apparatus in accordance with the invention.

FIG. 2 shows an example of a magnetic-field modulator. A series arrangement of an electronic switch 11 and a diode 12 is arranged between a terminal 10 at a positive potential Vp and a node 13. A series arrangement of an electronic switch 15 and a diode 16 is connected between the node 13 and a terminal 14 at a potential Vn opposite to Vp. The node 13 is connected to one (17) of the terminals of a field coil 18 for generating the magnetic field. The other terminals 19 of the field coil 18 is connected to a terminal 20 at earth potential. A capacitor 21 is arranged in parallel with the magnet coil 18. The magnet coil 18 and the capacitor 21 together constitute a parallel resonant circuit. The capacitance of the capacitor 21 is selected in such a way that the resonant period of the resonant circuit is smaller than the maximum permissible switching time required for the reversal of the magnetic field. In an apparatus for recording standard EFM signals a capacitance of 1 nF is suitable in conjunction with an inductance of 5 $\mu$H.

A control circuit 22 derives the control signal for the electronic switches 11 and 15 from the control signal Vs. The relationship between the states of the switches 11 and 15 and the logic values of the control signal Vs is given in Table 1.

TABLE 1

| Vs | switch 11 | switch 15 |
|---|---|---|
| 0 | open | closed |
| 1 | closed | open |

Figure 3:
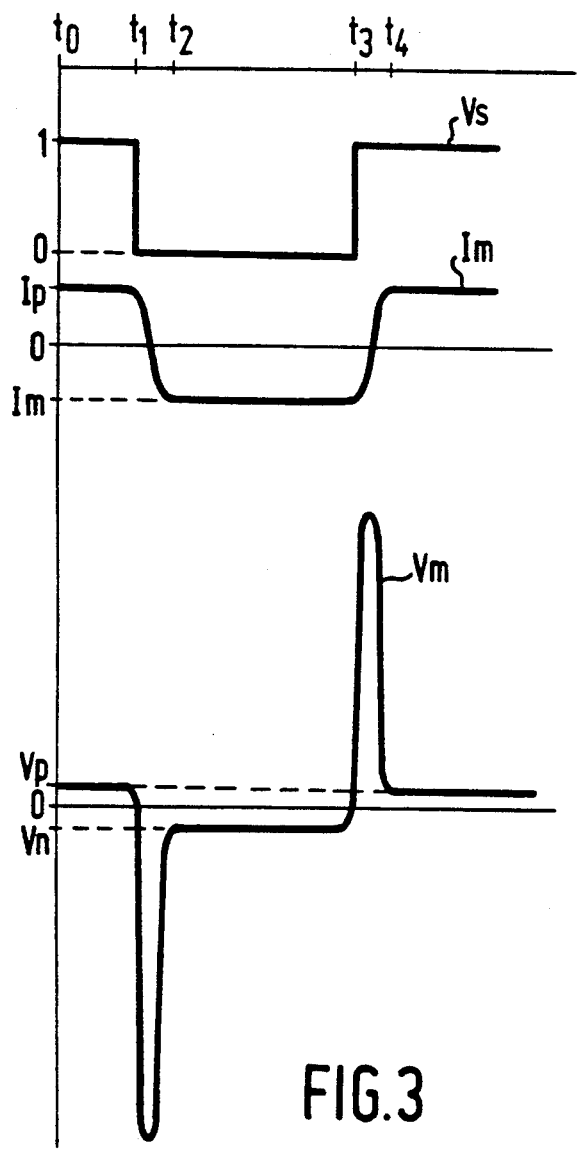
FIG. 3 shows a number of signal waveforms occurring in the magnetic-field modulator.

The operation of the magnetic-field modulator 8 will now be explained with reference to FIG. 3.

At the instant t0 the magnetic-field modulator is in a stable state in which the logic value of control signals Vs is "1", which means that the switch 11 is closed and the switch 15 is open. The voltage Vm across the field coil 18 is then equal to the potential difference (Vp) between the terminal 10 and the terminal 20. The current Im through the coil depends on the resistance of the field coil 18. In the case of a resistance having a customary value of 1 $\Omega$ and a customary desired current strength of 1 A the required potential difference can be as low as a few volts. In response to the "1"–"0" transition of the control signal Vs at the instant t1 the switch 11 is opened, so that the resonant circuit comprising the field coil 18 and the capacitor 21 is uncoupled from the terminal 10. In the resonant circuit this gives rise to a transient effect in the form of a sinusoidal variation of the current Im and the voltage Vm. Although the switch 15 is now closed the coupling of the terminal 17 is inhibited by the diode 16 as a result of the high negative voltage (50–100 V) induced in the field coil 18.

At the instant t2 the diode 16 is turned on, so that the potential on the terminal 17 becomes equal to the negative potential Vm. This instant t2 is situated substantially half a resonant period after the instant t1 at which the switch 11 is opened. At this instant the current has decreased to a value Im, whose absolute value is equal to the absolute value of the current at the instant t1 but whose sign is opposite to the sign of the current at the instant t1. As from the instant t2 the terminal 17 is coupled to the terminal carrying the negative potential Vn, the current value remains equal to In until at the instant t3 the logic value of Vs again changes from "0" to "1", so that the switch 11 is closed and the switch 15 is opened again, the direction of the current Im being consequently reversed. As is seen in FIG. 3 the duration of the pulse Vm is shorter than the information signal Vs hence, the resonant frequency of the resonant circuit is higher than the frequency of the modulation of the magnetic field.

In the embodiment shown in FIG. 2 the parallel resonant circuit comprises a parallel arrangement of the field coil 18 and the capacitor 21. In practice, it is found that in many cases it is not necessary to arrange a capacitor across the magnet coil 18 because the parasitic capacitance of the field coil, the switches and wiring is adequate for a correct operation of the magnetic-field modulator 8.

Further it is to be noted that the diodes 12 and 16 are not needed if the switches are controlled in such a way that after one of the switches has been opened the other switch is not closed until expiry of half a resonant period. However, because of its simplicity and immunity to resonant-frequency variations the embodiment comprising the diodes is to be preferred.

Figure 4:
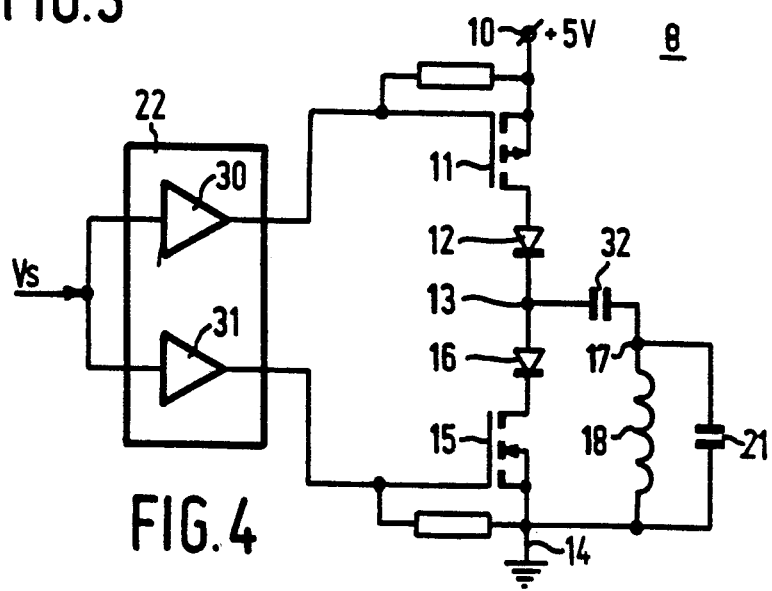

FIG. 4 shows an embodiment of the magnetic-field modulator 8 which can be powered by means of a single direct voltage supply. Elements corresponding to those in the embodiment shown in FIG. 2 bear the same reference numerals. The switch 11 comprises a transistor of the p-FET type, which is available for example under the type number BST 100. The switch 15 comprises a transistor of the n-FET type, which is available for example under the type number BST 70A. FET transistors are very suitable for use as switches in the present magnetic-field modulator, because these transistors are capable of withstanding the high reverse voltages arising during change-over of the switches. This is in contra distinction to bipolar transistors, which can handle only substantially lower reverse voltages and which in practice are therefore suitable only for recording signals of comparatively low frequency. Moreover, bipolar switching transistors which can handle the required large currents and high reverse voltages have substantially larger switching times than FET-transistors. The control circuit 22 comprises two buffer amplifiers 30 and 31, which suitably form part of the same integrated circuit, for example a circuit of the type 74HC125. This has the advantage that the delay times of the amplifier circuits 30 and 31 are substantially equal to each other, so that the instants of opening and closure of the switches are well adapted to each other.

The embodiment shown in FIG. 4 differs from that shown in FIG. 2 in that a capacitor 32 is arranged between the node 13 and the terminal 17 of the coil 18. The capacitor 32 together with the resonant circuit constitutes a high-pass filter to eliminate the d.c. component. This has the advantage that a single power supply can be used.

The embodiment shown in FIG. 4 is very suitable for recording d.c.-free encoded signals, such as for example EFM modulated signals. In such d.c.-free encoded signals the average time during which the signal has the logic value "1" is equal to the time that the logic value is "0". For the embodiment of FIG. 4 this means that the current in the coil is the same for both current directions, which is desirable for magneto-optical recording because the strength of the magnetic field should be the same for both directions of magnetization.

Figure 5:
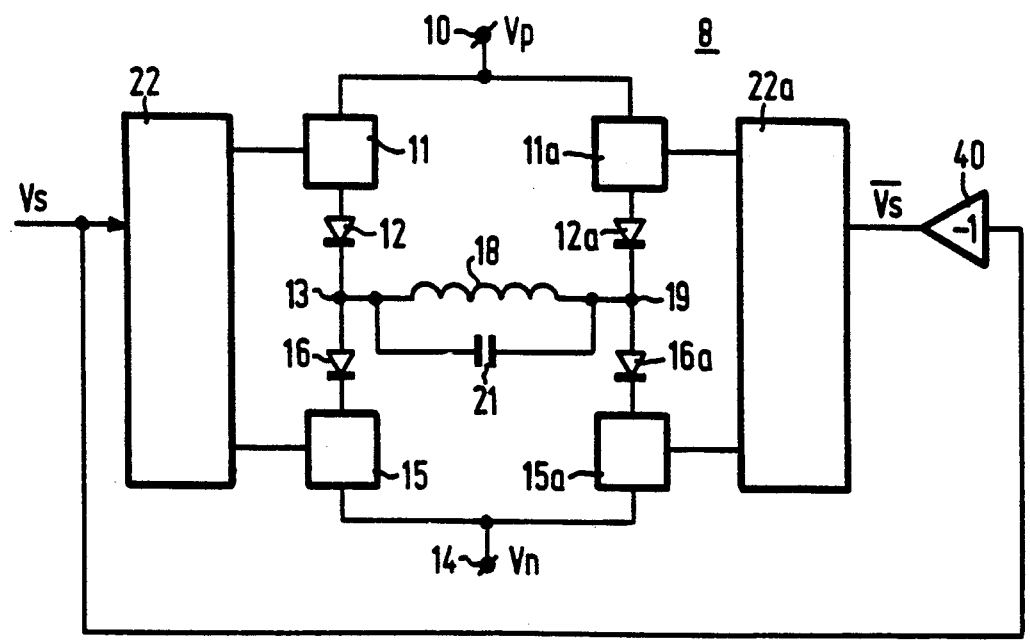

FIG. 5 shows an embodiment of the magnetic-field modulator which can also be powered by means of a single power supply and which is also adapted to record signals which are encoded in a non-d.c.-free manner.

In FIG. 5 elements corresponding to the elements in FIG. 2 and FIG. 4 bear the same reference numerals. In the present embodiment the node 13 and the terminal 19 constitute two diagonally opposite nodes of a bridge comprising a first branch which comprises the switches 11 and 15 and the diodes 12 and 16 and a second branch which is identical to the first branch and which comprises the switches 11a, 15a and the diodes 12a, 16a. The switches 11 and 15 are controlled in the manner described above by a control circuit 22, which derives the control signals for the switches 11 and 15 from the control signal Vs. The switches 11a and 15a are controlled in a similar way by a control circuit 22a which is identical to the control circuit 22. The control signals for the switches 11a and 15a are derived from the signal Vs which is derived from the signal Vs by means of an inverter circuit 40. In this embodiment of the magnetic-field modulator two diagonally opposite switches are closed while the other two switches are open depending on the logic value of the control signal Vs, so that the polarity of the voltage across the field coil depends on the logic value of the control signal Vs.

Apart from the afore-mentioned advantage the embodiment of FIG. 5 has the advantage that the high induction voltage produced during uncoupling is divided between two switches, so that very high induction voltages can be handled.

Figure 6:
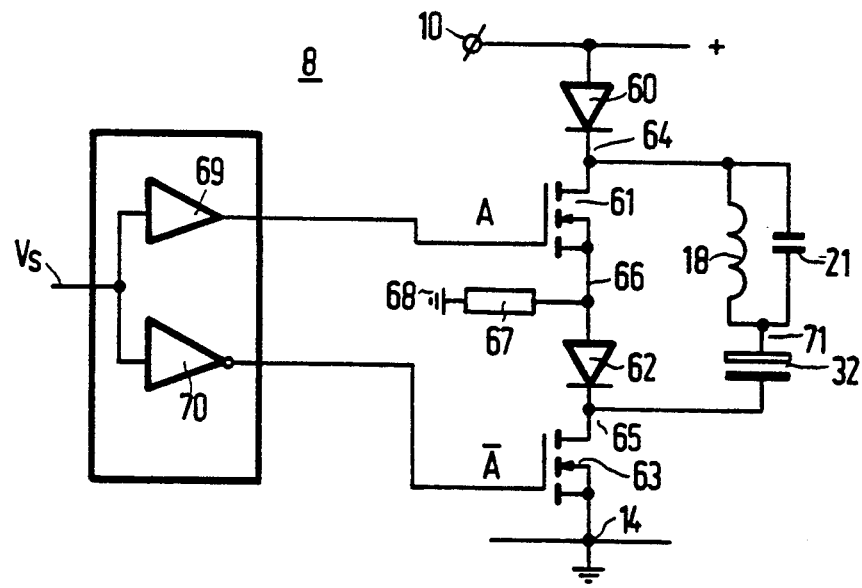

FIG. 6 shows another example of the magnetic-field modulator 8. Between the terminal 10 and terminal 14 a series arrangement is situated, which comprises, in this order, a diode 60, an n-channel FET 61, a diode 62, and an n-channel FET 63. Together with the capacitor 32 the parallel resonant circuit comprising the field coil 18 and the capacitor 21 again constitutes the high-pass filter, which is arranged between a junction point 64 (between the diode 60 and the transistor 61) and a junction point 65 (between the diode 62 and the transistor 63).

A non-inverting amplifier 69 and an inverting amplifier 70 derive the drive signals A and $\overline{A}$ for the transistors 61 and 63 respectively from the signal Vs. These drive signals drive the FETs 61 and 63 in such a way that alternately only one of these transistors 61 and 63 is turned on. When the transistor 63 conducts and the transistor 61 is cut off the field coil 18 is energized via the current path comprising the diode 60, the field coil 18, the capacitor 32 and the transistor 63. If subsequently the transistor 63 is turned off and the transistor 61 is turned on a transient effect is produced in the resonant circuit comprising the field coil 18 and the capacitor 21, so that for a time interval corresponding to half the resonant period of the resonant circuit an induction voltage is produced, which keeps the diode 62 in the cut-off state. At the end of said transient interval the current in the field coil 18 is reversed and the diode is turned on again, causing the capacitor 32 to discharge via the circuit comprising the diode 62, the transistor 61 and the field coil. The capacitance of the capacitor 32 is selected in such a way that it may be regarded as a short-circuit for the frequencies with which the transistors 61 and 63 are switched. If the drive signals A and $\overline{A}$ are d.c.-free as in the case that EFM-signals are recorded, this means that the voltage across the capacitor 32 is always substantially equal to half the voltage difference between the terminals 10 and 14, so that the current through the field coil continually varies between a negative value and a positive value, said positive and negative currents being equal in absolute value. This is essential for magneto-optical recording because during recording the magnetic fields thus produced should have the same strength for both possible directions.

The magnetic-field modulator shown in FIG. 6 comprises two n-channel FETs instead of one p-channel FET and one n-channel FET, as in the magnetic-field modulator shown in FIG. 4. As the heat dissipation in the currently available p-channel FETs is substantially higher than in n-channel FETs the heat dissipation in the circuit for energizing the field coil in the embodiment shown in FIG. 6 will be substantially lower than in the embodiment shown in FIG. 4.

For a reliable operation of the circuit shown in FIG. 6, however, it is desirable to couple the junction point 66 between the transistor 61 and and the diode 62 to a point 68 of constant potential via an impedance 67. This is because it is necessary that, in order to turn on the transistor 61, the gate-source voltage of the transistor should have a well-defined value. In the absence of the impedance 67 the gate-source voltage would not be well-defined during the time interval in which the diode 62 is cut-off. Moreover, it is to be noted that the circuit shown in FIG. 6 may also be equipped with p-channel FETs if the polarity of the voltage between the terminals 10 and 14 is reversed and, in addition, the cathodes and anodes of the diodes 60 and 62 are interchanged.

Further, it is to be noted that in principle the capacitor 21 may be replaced by two capacitors, one of these capacitors being connected between the junction point 64 and the terminal 14 and the other capacitor being connected between the terminal 14 and the junction point 71 between the field coil 18 and the capacitor 32. If it alternatively possible to arrange the capacitor 21 between the junction points 64 and 65. This is because the capacitor 32 may again be regarded as a short-circuit for the prevailing switching frequencies.

Figure 7:
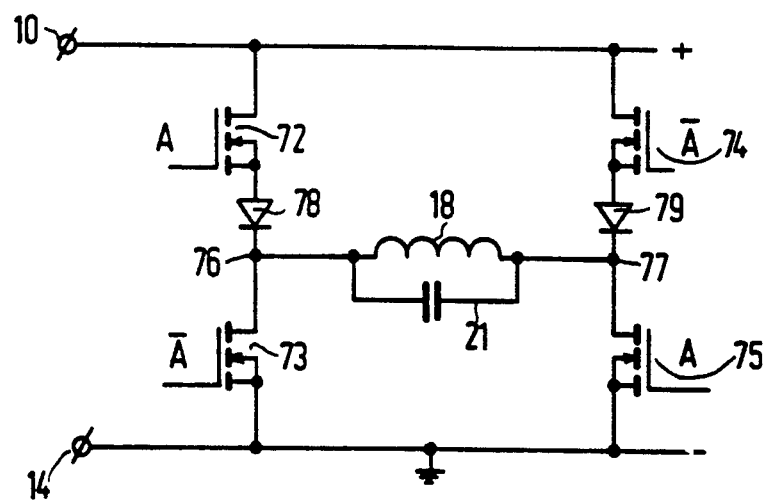

FIG. 7 shows a field-coil energizing circuit comprising four n-channel FETs 72, 73, 74 and 75 and a bridge circuit. The parallel arrangement of the field coil 18 and the capacitor 21 is connected between two diagonally opposed bridge nodes. The two other nodes the bridge are connected to the terminals 10 and 14. A diode 78 is arranged between the transistor 72 and the junction point 76 and a diode 79 between the transistor 74 and the junction point 77 in order to inhibit the current supply from the d.c. source connected to the terminals 10 and 14 during the reversal of the current in the field coil 18. The use of low-dissipation n-channel FETs again ensures a minimal dissipation in the circuit.

What is claimed is:

1. A magneto-optical recording apparatus for recording an information signal on a magneto-optical record carrier, which recording apparatus comprises a field coil for generating a magnetic field to the record carrier, an energizing circuit for energizing the field coil, and a control circuit for controlling the energizing circuit depending on the information signal in order to modulate the magnitude of the generated magnetic field in conformity with the information signal, characterized in that the field coil is arranged in a parallel resonant circuit having a resonance period, in that the energizing circuit comprises switches controlled by the control circuit for alternately connecting first and second current paths in order to energize the field coil by said current paths alternately with a positive current during first time intervals and a negative current during second time intervals, and current-inhibiting means disposed in said first and second current paths constructed to inhibit, after interruption of one of the current paths by said switches, the current supply to the field coil by the other current path of said first and second current paths for a transient interval corresponding to substantially half the resonant period of the resonant circuit, which transient interval is shorter than said first and second time intervals.

2. A magneto-optical recording apparatus as claimed in claim 1, characterized in that the current-inhibiting means comprise rectifying elements arranged in the current paths.

3. A magneto-optical recording apparatus as claimed in claim 1, characterized in that said current paths have a common part and that a high-pass filter is arranged in the common part of the current paths and the field coil, said filter forming a part of the parallel resonant circuit, in that a first one of said current paths is adapted to connect, when the respective connected switch is closed, said high pass filter to a d.c. source, and in that a second one of said current paths includes means to effectively short-circuit, when the respective connected switch is closed, said high pass filter.

4. A magneto-optical recording apparatus as claimed in claim 3, characterized in that the high-pass filter comprises a capacitor arranged in series with the field coil.

5. A magneto-optical recording apparatus as claimed in claim 1, characterized in that the energizing circuit comprises a bridge circuit having first and second bridge arms and nodes which has a switch arranged in each of its bridge arms, the resonant circuit being connected between two diagonally opposed nodes of the bridge, the first current path comprising two diagonally opposed bridge arms and the second current path comprising the two other bridge arms.

6. A magneto-optical recording apparatus as claimed in the claim 1, characterized in that the switches are FET-transistors.

7. A magneto-optical recording apparatus as claimed in claim 6, characterized in that the energizing circuit and current inhibiting means comprise a series arrangement to be connected to the d.c. source, which series arrangement comprise, in this order, a first rectifying element, a first FET-transistor, a second rectifying element, and a second FET transistor of the same channel-type as the first FET-transistor, the high-pass filter being connected to the junction point between the first rectifying element and the first FET-transistor and to the junction point between the second rectifying element and the second FET-transistor, the energizing circuit further comprising an impedance for coupling the junction point between the first FET-transistor and the second rectifying element to a point of fixed potential.

8. A magneto-optical recording apparatus as claimed in claim 7, characterized in that the first and second FET-transistors are n-channel FET-transistors.

* * * * *